United States Patent
Peeters et al.

(10) Patent No.: US 10,216,484 B2
(45) Date of Patent: Feb. 26, 2019

(54) RANDOM NUMBER GENERATION WITH FERROELECTRIC RANDOM ACCESS MEMORY

(71) Applicant: Texas Instruments Incorporated, Dallas, TX (US)

(72) Inventors: Eric Thierry Peeters, Frisco, TX (US); William Francis Kraus, Plano, TX (US); Manuel Gilberto Aguilar, Plano, TX (US); John Anthony Rodriguez, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 387 days.

(21) Appl. No.: 14/301,307

(22) Filed: Jun. 10, 2014

(65) Prior Publication Data

US 2015/0355886 A1 Dec. 10, 2015

(51) Int. Cl.
| | |
|---|---|
| G06F 12/02 | (2006.01) |
| G06F 7/58 | (2006.01) |
| G11C 7/20 | (2006.01) |
| G11C 29/04 | (2006.01) |
| G11C 11/22 | (2006.01) |
| G11C 29/44 | (2006.01) |

(52) U.S. Cl.
CPC ............ *G06F 7/588* (2013.01); *G11C 7/20* (2013.01); *G11C 11/225* (2013.01); *G11C 29/04* (2013.01); *G11C 2029/4402* (2013.01)

(58) Field of Classification Search
None
See application file for complete search history.

(56) References Cited

U.S. PATENT DOCUMENTS

| | | |
|---|---|---|
| 7,482,657 B1 | 1/2009 | Lucero et al. |
| 7,558,969 B1 | 7/2009 | Lucero et al. |
| 7,602,666 B1 | 10/2009 | Lucero et al. |

(Continued)

OTHER PUBLICATIONS

T.S. Moise et al, "Demonstration of a 4Mb, High Density Ferroelectric Memory Embedded within a 130nm, 5LM Cu/FSG Logic Process", IEDM '20 International Electron Devices Meeting, San Francisco, CA, Dec. 8-11, 2002, pp. 535-538.

(Continued)

*Primary Examiner* — Charles Rones
*Assistant Examiner* — Ryan Dare
(74) *Attorney, Agent, or Firm* — Michelle F. Murray; Charles A. Brill; Frank D. Cimino

(57) ABSTRACT

A system on chip (SoC) may include a nonvolatile ferroelectric random access memory (FRAM). A random number may be created by applying operating power to the ferroelectric random access memory (FRAM) device and reading a sequence of virgin memory locations within the FRAM device to produce the random number sequence. The sequence of virgin memory locations had previously never been written. The random number may be produced during an initial boot of the SoC, for example. Alternatively, the random number may be saved by a test station during testing of the FRAM device after fabrication of the FRAM device. A memory test of the FRAM may then be performed, after which the random number may be stored in a defined location in the FRAM.

20 Claims, 7 Drawing Sheets

(56) References Cited

U.S. PATENT DOCUMENTS

| | | | | |
|---|---|---|---|---|
| 2007/0067375 A1* | 3/2007 | Inaoka | ............... | G06F 7/58 708/250 |
| 2014/0040338 A1* | 2/2014 | Van Der Sluis | ...... | H04L 9/0866 708/254 |
| 2014/0136583 A1* | 5/2014 | Hyde | ............... | G06F 7/588 708/250 |
| 2014/0146607 A1* | 5/2014 | Nagai | ............... | G06F 7/58 365/185.04 |
| 2014/0169092 A1* | 6/2014 | Miyamoto | ............ | G11C 16/26 365/185.09 |

OTHER PUBLICATIONS

Daniel E. Holcomb et al, Power-up SRAM State as an Identifying Fingerprint and Source of True Random Numbers, IEEE Transactions on Computers, vol. 57, No. 11, Nov. 2008, pp. 1-14.

Elaine Barker and John Kelsey, "Recommendation for Random Number Generation Using Deterministic Random Bit Generators", NIST Special Publication 800-90A, Jan. 2012, pp. 1-136.

"Physical unclonable function", Wikipedia, pp. 1-10, available at http://en.wikipedia.org/w/index.php?title=Physical_unclonable_function&oldid=610715141 on May 29, 2014.

* cited by examiner

RANDOM NUMBER GENERATION WITH FERROELECTRIC RANDOM ACCESS MEMORY

FIELD OF THE INVENTION

This invention generally relates to Ferroelectric nonvolatile memory cells and their use in a system, and in particular, to generating a random number by reading the memory cells.

BACKGROUND OF THE INVENTION

System on Chip (SoC) is now a commonly used concept; the basic approach is to integrate more and more functionality into a given device. Many SoC designs pair a microprocessor core, or multiple cores, with various peripheral devices and memory circuits, some of which may be non-volatile.

Ferroelectric random access memory (FRAM) is a nonvolatile memory technology with similar behavior to DRAM (dynamic random access memory). Each individual bit can be accessed, but unlike EEPROM (electrically erasable programmable read only memory) or Flash, FRAM does not require a special sequence to write data nor does it require a charge pump to achieve required higher programming voltages. Each ferroelectric memory cell contains one or more ferroelectric capacitors (FeCap).

BRIEF DESCRIPTION OF THE DRAWINGS

Particular embodiments in accordance with the invention will now be described, by way of example only, and with reference to the accompanying drawings.

Figure 1:
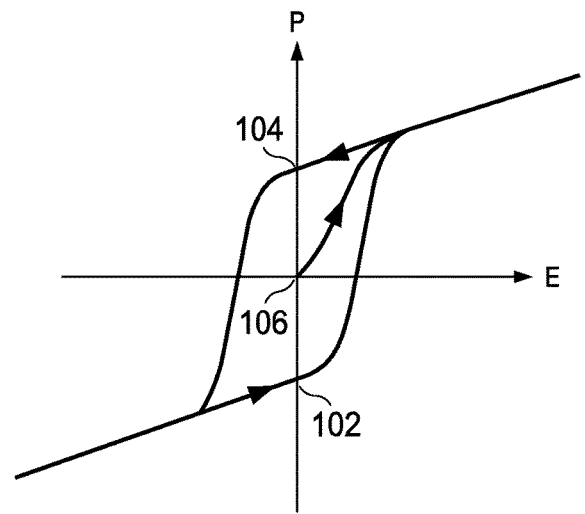
FIG. 1 is a plot illustrating polarization hysteresis exhibited by a ferroelectric capacitor.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Identification and/or random number generation are important primitives in many digital circuits. A static identity is required by many applications, including tracking and authentication. Random numbers are essential to many cryptographic schemes; if random numbers can be guessed with any accuracy, the security of any scheme which relies on them is broken. Identification and random number generation is needed in many low cost devices, such as sensors, radio frequency identification (RFID) tags, etc., for example. It has now been determined that a unique and random number may be self-generated by a virgin ferroelectric random access memory (FRAM) array. A virgin FRAM contains spontaneous randomly polarized memory cells plus some technology randomness caused by process variations that may be captured the first time the virgin FRAM is read. Embodiments of the invention may simply write back this captured randomness in a known location to be able to use it during the lifetime of the product. An example simple system on a chip (SoC) may include: an FRAM memory array; a microcontroller with access to the array; and a mechanism that can perform the virgin read, such as a built in self test (BIST) function within a boot-code. Alternatively, the virgin read may be performed by a tester during product test after product fabrication, for example.

As used herein, the term "virgin memory locations" or "virgin bit" refers to FRAM bit cells that have never been written. For a cryptographic application, a random number may be generated by reading a sufficient number of virgin bitcells that conveys enough entropy bits to fulfill the cryptographic strength requirement of the application. Each virgin bit may convey less that 1-bit of entropy; therefore, if an application needs 256 bits for generating a key, an embodiment may need to read a larger number of virgin bit locations, such as 300 bits or 512 bits, for example. The entropy bit to virgin bit ratio may depend on inherent bias of a given FRAM cell design or production technology, for example. A definition of entropy and security strength is described in more detail in "Recommendation for Random Number Generation Using Deterministic Random Bit Generators," NIST SP 800-90a, 2012, which is incorporated by reference herein. Embodiments of the invention may read a sufficient number of memory bit locations to produce a random number with sufficient entropy for a desired security strength, for example. Similarly, for identification number applications, a larger number of virgin bits may be required to guarantee a minimum size tracking number. While it is desirable for a tracking number to be unique, there is a small chance that the same random number may be produced more than once. Reading a large number of bits will generally produce a unique random number; therefore the probability producing the same random number more than once may be extremely low, which may be adequate for many identification and tracking applications.

Ferroelectric random access memory (FRAM) is a nonvolatile memory technology with similar behavior to DRAM (dynamic random access memory). Each individual bit can be accessed, but unlike EEPROM (electrically erasable programmable read only memory) or Flash, FRAM does not require a special sequence to write data nor does it require higher programming voltages. Each ferroelectric memory cell contains one or more ferroelectric capacitors (FeCap).

While the term SoC is used herein to refer to an integrated circuit that contains one or more system elements such as a microcontroller and a non-volatile FRAM, various embodiments may include any number of functional circuits and modules, for example.

FIG. 1 is a plot illustrating polarization hysteresis exhibited by a ferroelectric capacitor. The general operation of ferroelectric bit cells is known. When most materials are polarized, the polarization induced, P, is almost exactly proportional to the applied external electric field E; so the polarization is a linear function, referred to as dielectric polarization. In addition to being nonlinear, ferroelectric materials demonstrate a spontaneous nonzero polarization as illustrated in FIG. 1 when the applied field E is zero. The distinguishing feature of ferroelectrics is that the spontaneous polarization can be reversed by an applied electric field; the polarization is dependent not only on the current electric field but also on its history, yielding a hysteresis loop. The term "ferroelectric" is used to indicate the analogy to ferromagnetic materials, which have spontaneous magnetization and also exhibit hysteresis loops.

The dielectric constant of a ferroelectric capacitor is typically much higher than that of a linear dielectric because of the effects of semi-permanent electric dipoles formed in the crystal structure of the ferroelectric material. When an external electric field is applied across a ferroelectric dielectric, the dipoles tend to align themselves with the field direction, produced by small shifts in the positions of atoms that result in shifts in the distributions of electronic charge in the crystal structure. After the charge is removed, the dipoles retain their polarization state. Binary "0" s and "1" s may be stored as one of two possible electric polarizations in each data storage cell. For example, in the figure a "1" may be encoded using the negative remnant polarization 102, and a "0" may be encoded using the positive remnant polarization 104, or vice versa.

The "curved inner trace" that starts at E=0, P=0 as indicated at 106, represents the ideal response of a virgin ferroelectric capacitor to an interrogation pulse. This P=0 starting point represents the net spontaneous polarization before any data has been written. In practice, this initial value of P is not exactly zero, but may be slightly positive (towards 104) or slightly negative (towards 102). Thus, after an integrated circuit is fabricated, each bit cell in a FRAM array will have a random spontaneous nonzero polarization. When a virgin bit is read, the random value may be obtained. Once the cell has been written to with a known value, the random value will not be available. Since the FRAM is non-volatile, even after extended periods of being powered off, the random values will not return.

During fabrication of a SoC that contains an FRAM, any testing that writes to the FRAM may destroy the random state of the bit cells. Techniques for testing a FRAM array while preserving the ability to obtain a random number from a sequence of virgin memory locations will be described herein.

Embodiments of the invention may use various configurations of FRAM cells. For example, some SoC's may include a large array of non-volatile FRAM cells for storing processor instructions and data, for example. In this case, each FRAM cell may be a simple 1T-1C cell, for example. A one transistor, one capacitor (1T-1C) storage cell design in an FRAM array is similar in construction to the storage cell in widely used DRAM in that both cell types include one capacitor and one access transistor. In a DRAM cell capacitor, a linear dielectric is used, whereas in an FRAM cell capacitor the dielectric structure includes ferroelectric material, typically lead zirconate titanate (PZT). The general construction of 1T-1C cells is well known; for example, an 8 Mbit array using 1T-1C cells is described in "Manufacturable High-Density 8 Mbit One Transistor-One Capacitor Embedded Ferroelectric Random Access Memory", K. R. UDAYAKUMAR, et al, published Apr. 25, 2008, and is incorporated by reference herein.

In another embodiment, a complimentary differential cell may include two capacitors and two transistors (2T-2C). In other embodiments, a SoC may only need a small amount of non-volatile FRAM. Due to the overhead of accessing a DRAM type array, a 1T-1C cell is less desirable for use in small arrays. In this case, a four capacitor, six transistor (4C-6T) cell is a common type of cell that is easier to use in small arrays, for example. For illustration purposes, an example of a typical 2C-2T cell, a 4C-12T cell that includes a sense amp in each cell, and a 2C-3T cell that uses a remote sense amp will now be described in order to better understand how an FRAM may be used to generate a random number.

Figure 2:
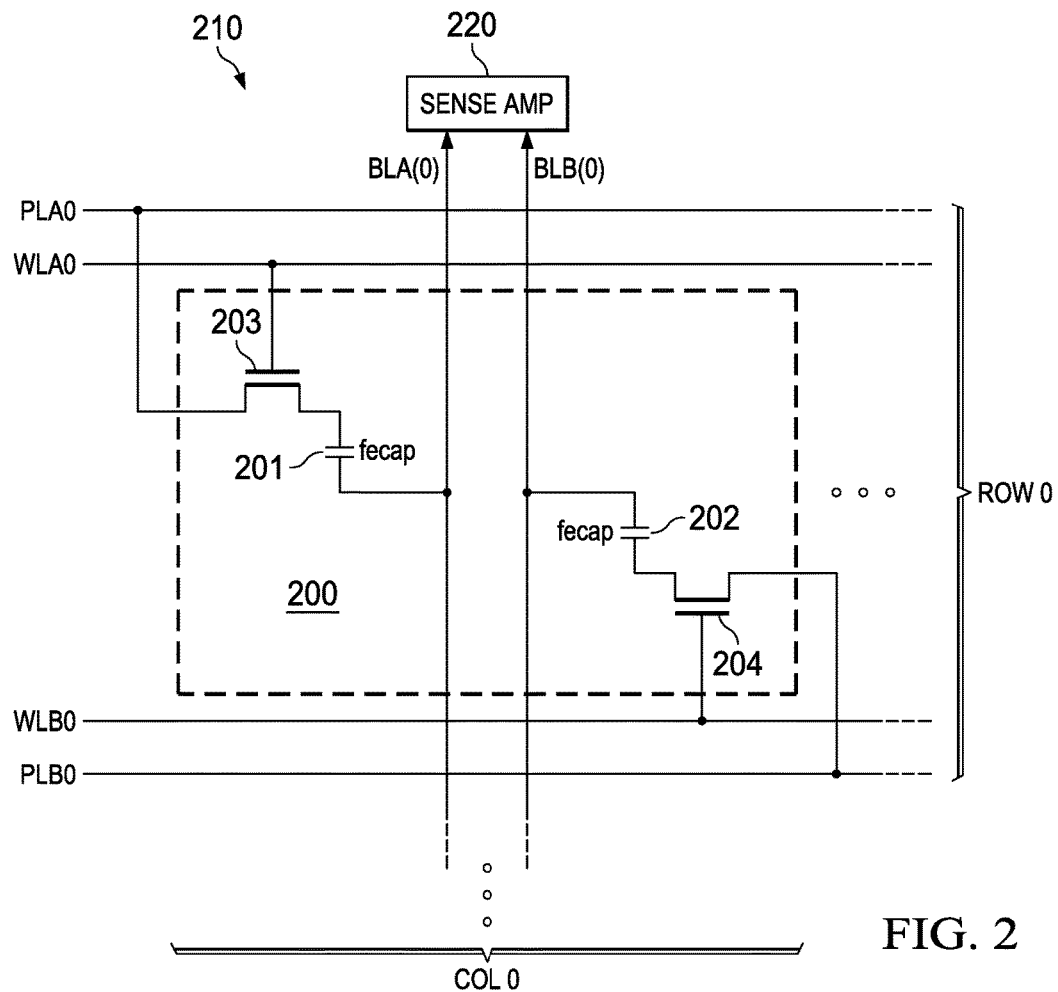
FIGS. 2-5 are schematics illustrating several embodiments of a ferroelectric nonvolatile bit cell and array.

FIG. 2 is a schematic illustrating one embodiment of a bitcell 200 that is included within ferroelectric nonvolatile array 210. Bitcell 200 includes two ferroelectric capacitors (FeCaps) and two pass-transistors (2C-2T). Array 210 includes many rows of bitcells; in this example each row of bitcells provides storage for a 32 bit data word. In this example, bitcell 200 represents bit 0 in word 0 of array 210. The two FeCaps 201, 202 are arranged as a pair in a differential arrangement and coupled to respective bitlines BLA(0), BLB(0) and thereby to a differential sense amp 220. In this example, each column of bitcells is coupled to one sense amp.

Bitcell 200 may be read by asserting wordlines WLA0, WLB0 that are coupled to a control terminal on pass-gates 203, 204. In some embodiments, a single wordline may be used to activate both pass-gates. While the wordlines are active, plate lines PLA0, PLB0 are also activated, which causes any charge that was stored in FeCaps 201, 202 to be dumped onto the bitlines and then differentially sensed by sense amp 220.

Bitcell 200 may be written by asserting the wordlines to enable pass-gates 203, 204 and then impressing a field across FeCap 201 in one direction using plate line PLA0 and bitline BLA(0) and impressing an inverse field across FeCap 202 using plate line PLB0 and bitline BLBA(0). One pair of fields represents a bit value of logical "0" while the opposite pair of fields represents a logical "1".

For FeCap based circuits, reading data from the FeCap's may partially depolarize the capacitors. For this reason, reading data from FeCaps is considered destructive in nature; i.e. reading the data may destroy the contents of the FeCap's or reduce the integrity of the data at a minimum. For this reason, if the data contained in the FeCap's is expected to remain valid after a read operation has occurred, the data must be written back into the FeCaps.

Figure 3:
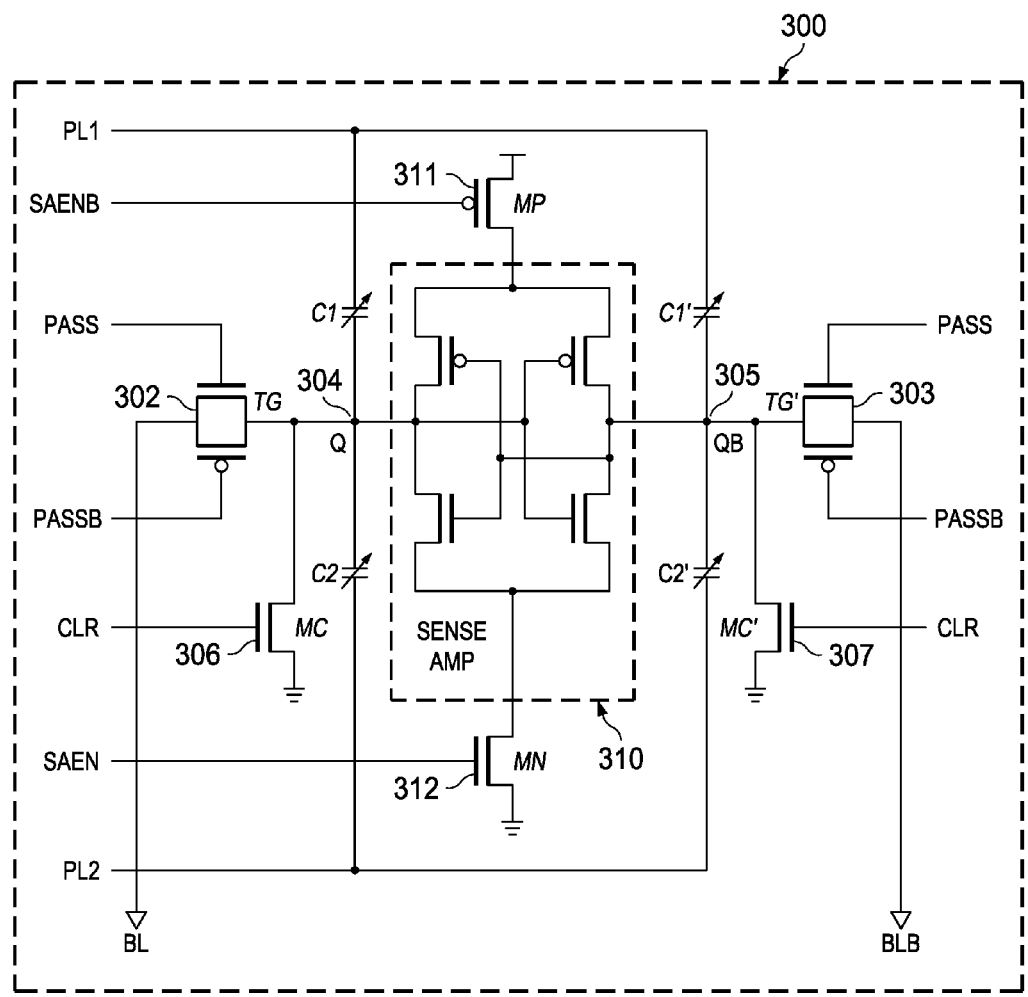

FIG. 3 is a schematic illustrating another embodiment of a ferroelectric nonvolatile bitcell 300 that includes four capacitors and twelve transistors (4C-12T). The four FeCaps are arranged as two pairs in a differential arrangement. FeCaps C1 and C2 are connected in series to form node Q 304, while FeCaps C1' and C2' are connected in series to form node QB 305, where a data bit is written into node Q and stored in FeCaps C1 and C2 via bit line BL and an inverse of the data bit is written into node QB and stored in FeCaps C1' and C2' via inverse bitline BLB. Sense amp 310 is coupled to node Q and to node QB and is configured to sense a difference in voltage appearing on nodes Q, QB when the bitcell is read. The four transistors in sense amp 310 are configured as two cross coupled inverters to form a latch. Pass gate 302 is configured to couple node Q to bitline B and pass gate 303 is configured to couple node QB to bit line BLB. Each pass gate 302, 303 is implemented using a PMOS device and an NMOS device connected in parallel. This arrangement reduces voltage drop across the pass gate during a write operation so that nodes Q, QB are presented with a higher voltage during writes and thereby a higher polarization is imparted to the FeCaps. Plate line 1 (PL1) is coupled to FeCaps C1 and C1' and plate line 2 (PL2) is coupled to FeCaps C2 and C2'. The plate lines are use to provide biasing to the FeCaps during reading and writing operations.

Alqternatively, in another embodiment the CMOS pass gates can be replaced with NMOS pass gates that use a pass gate enable that has a voltage higher than VDDL. The magnitude of the higher voltage must be larger than the usual NMOS Vt in order to pass an un-degraded signal from the bitcell Q/QB nodes to/from the bitlines BL/BLB. Therefore, in such an embodiment, Vpass_gate_control should be >VDDL+Vt.

To read bitcell 300, plate line PL1 is switched from low to high while keeping plate line PL2 low. This induces voltages on nodes Q, QB whose values depend on the capacitor ratio between C1-C2 and C1'-C2' respectively. The induced voltage in turn depends on the remnant polarization of each FeCap that was formed during the last data write operation to the FeCap's in the bit cell. The remnant polarization in effect "changes" the effective capacitance value of each FeCap which is how FeCaps provide non-volatile storage. For example, when a logic 0 was written to bitcell 300, the remnant polarization of C2 causes it to have a lower effective capacitance value, while the remnant polarization of C1 causes it to have a higher effective capacitance value. Thus, when a voltage is applied across C1-C2 by switching plate line PL1 high while holding plate line PL2 low, the resultant voltage on node Q conforms to equation (1). A similar equation holds for node QB, but the order of the remnant polarization of C1' and C2' is reversed, so that the resultant voltages on nodes Q and QB provide a differential representation of the data value stored in bit cell 300.

$$V(Q) = V(PL1)\left(\frac{C2}{C1+C2}\right) \quad (1)$$

Figure 4:
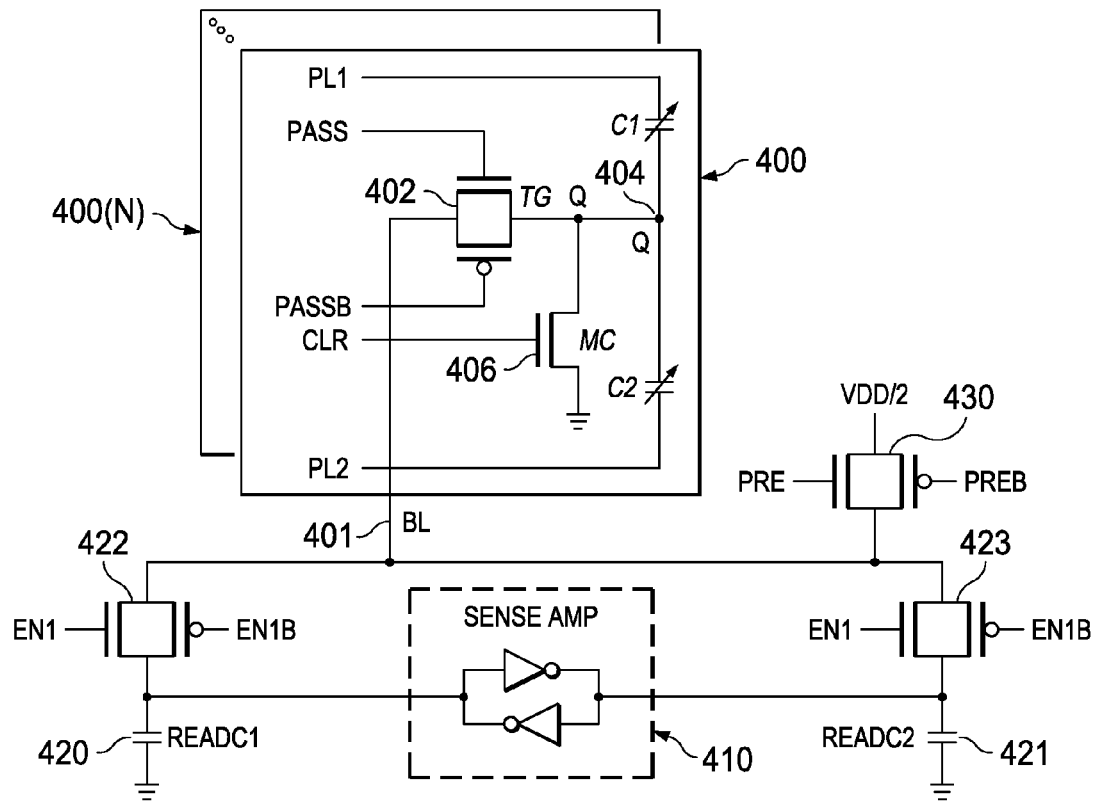

FIG. 4 is a schematic illustrating another embodiment of a ferroelectric nonvolatile bit cell 400, a 2C-3T self-referencing bitcell. The previously described 4-FeCap based bitcell 300 uses two FeCaps on each side of a sense amp to get a differential read with double the margin as compared to a standard 1C-1T FRAM bitcell. However, a 4-FeCap based bitcell has a larger area and may have a higher variation because it uses more FeCaps.

Bitcell 400 helps achieve a differential 4-FeCap like margin in lower area by using itself as a reference, referred to herein as self-referencing. By using fewer FeCaps, it also has lower variation than a four FeCap bitcell. Typically, a single sided cell needs to use a reference voltage that is in the middle of the operating range of the bitcell. This in turn reduces the read margin by half as compared to a two sided cell. However, as circuit fabrication process moves, the reference value may become skewed, further reducing the read margin. A self reference scheme allows comparison of a single sided cell against itself, thereby providing a higher margin. Tests of the self referencing cell described herein have provided at least double the margin over a fixed reference cell.

The initial state of node Q, plate lines PL1 and PL2 are all 0, so there is no DC bias across the FeCaps when the bitcell is not being accessed. To begin a read operation, PL1 is toggled high while PL2 is kept low A signal develops on node Q from a capacitance ratio based on the retained polarization of the FeCaps from a last data value previously written into the cell, as described above with regard to equation 1. This voltage is stored on a read capacitor 420 external to the bitcell by passing the voltage though transfer gate 402 onto bit line BL in response to enable signal PASS and then through transfer gate 422 in response to a second enable signal EN1. BL and the read capacitors are pre-charged to VDD/2 via precharge circuit 430 before the pass gates 402, 422, and 423 are enabled in order to minimize signal loss via charge sharing when the recovered signals on Q are transferred via BL to the read storage capacitors 420 and 421. Then, PL1 is toggled back low and node Q is discharged using clamp transistor 406 during time period s2. Next, PL2 is toggled high keeping PL1 low during time period s3. A new voltage 904 develops on node Q, but this time with the opposite capacitor ratio. This voltage is then stored on another external read capacitor 421 via transfer gate 423. Thus, the same two FeCaps are used to read a high to form a differential signal. Sense amplifier 410 can then determine the state of the bitcell by using the voltages stored on the external read capacitors 420, 421.

Figure 5:
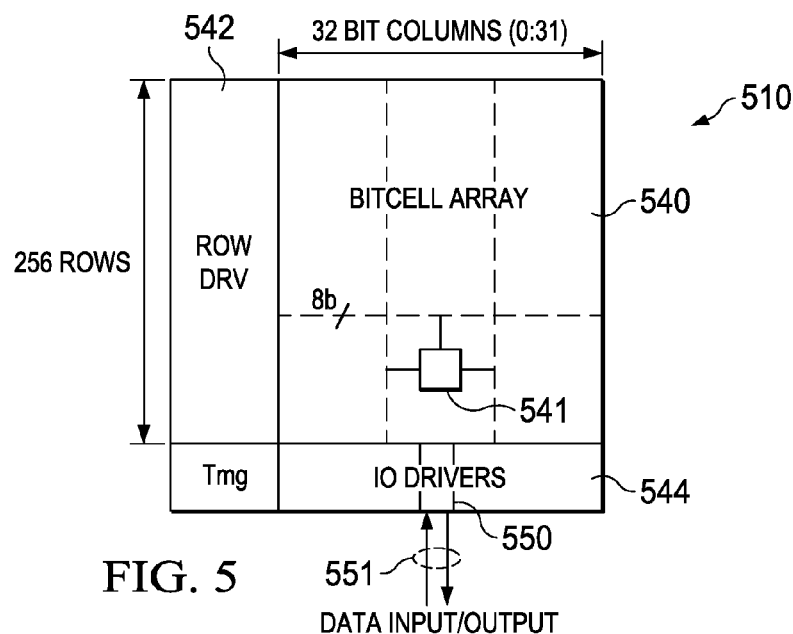

FIG. 5 is a block diagram illustrating an array 510 of FRAM bit cells. While a FRAM array may be implemented in various numbers of n rows of m column configurations, in this example, FRAM array 110 is implemented with an array 540 of 256 rows and thirty-two columns of bitcells. Each individual bit cell, such as bitcell 541, is coupled to a set of control lines provided by row drivers 542. The control signals described earlier, including plate lines (PL1, PL2), sense amp enable (SAEN), transfer gate enable (PASS), and clear (CLR) may all be driven by the row drivers. There is a set of row drivers for each row of bitcells. Multiple arrays 510 may be combined as segments of a larger array, for example.

Each individual bit cell, such as bitcell 541 is also coupled via the bitlines to a set of input/output (IO) drivers 544. In this implementation, there are thirty-two sets of IO drivers, such as IO driver set 550. Each driver set produces an output signal 551 that provides a data value when a row of bit lines is read. Each bitline runs the length of a column of bitcells and couples to an IO driver for that column. Each bitcell may be implemented as 2C-3T bitcell 400, for example. In this case, a single bitline will be used for each column, and the sense amps and read capacitors will be located in IO driver block 544. In another implementation of array 510, each bitcell may be implemented as 2C-2T bitcell 200 or 4C-12T bit cell 300, for example. In this case, the bitlines will be a differential pair with two IO drivers for each column. A comparator may receive the differential pair of bitlines and produces a final single bit line that is provided to the output latch. Other implementations of array 510 may use other known or later developed bitcells, such as: a 4C-6T, 1C-1T, 2C-3T, etc., for example.

Random Number Generation

Regardless of the configuration of the FRAM bit cell in a particular SoC embodiment, when the SoC is fabricated, each FeCap in each FRAM cell will have an initial spontaneous nonzero polarization as illustrated in FIG. 1 when the applied field E is zero. As long as each FRAM cell and its corresponding sensing circuitry are designed to be balanced, then there may be about a 50% chance that any given cell will report an initial value of one.

As mentioned before, referring again to FIG. 1, the "curved inner trace" that starts at E=0, P=0 as indicated at 106, represents the ideal response of a virgin ferroelectric capacitor to an interrogation pulse. This P=0 starting point represents the net spontaneous polarization before any data has been written. In practice, this initial value of P is not exactly zero, but is slightly positive (towards 104) or slightly negative (towards 102). When a virgin 2T-2C bit-cell is interrogated, this slight variation between the capacitors within the bit-cell will cause the sense amp to detect a "1" or a "0". This similar self-referencing action applies in some of the other FRAM architectures.

Figure 6:
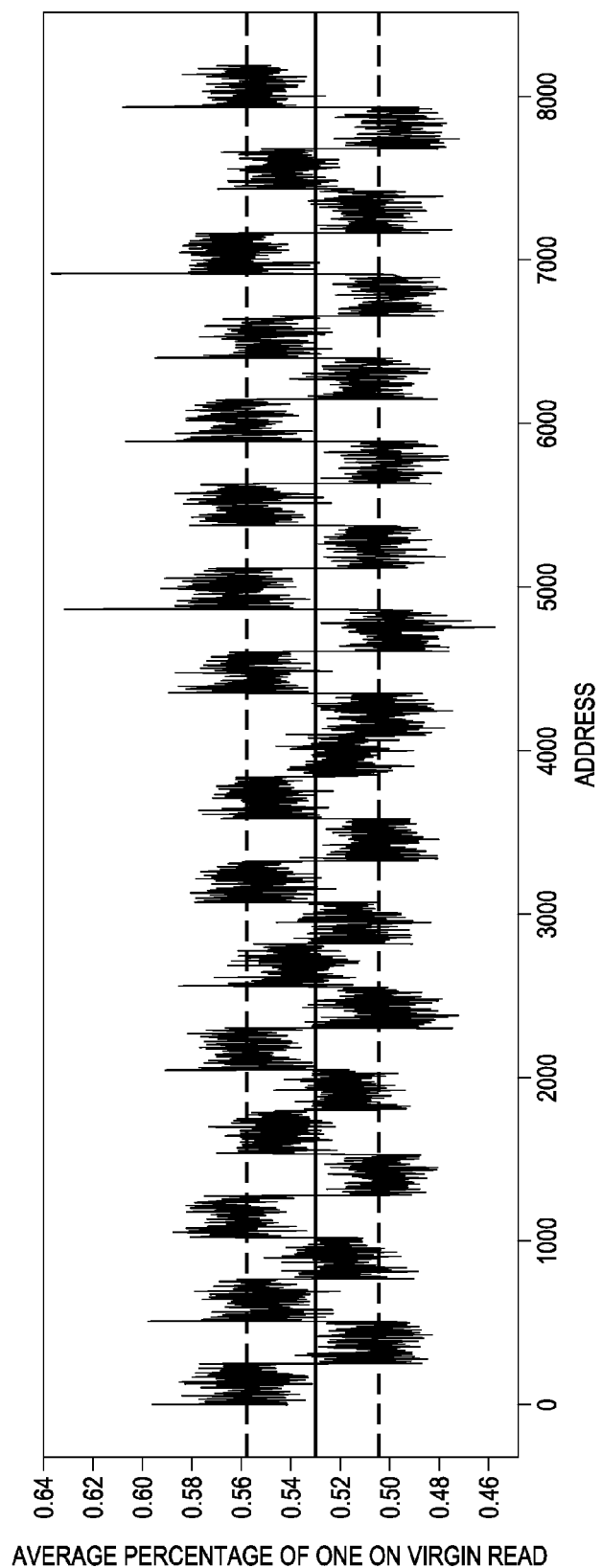
FIGS. 6-7 are plots illustrating percentage of bit's that initially read as a one in example FRAM arrays.

FIG. 6 is a plot illustrating the results of a virgin read of an 8 k×32 bit array of FRAM cells, such as array 510 illustrated in FIG. 5. An average value for the 32 bits read from each row is plotted for all 8 k rows. For illustration purposes, the distribution of random ones and zeros is provided on FIG. 6 and is fairly consistent in a range of approximately 0.48-0.58 percent ones across the entire 8 k rows of the array. In this example, the slight tendency towards "1" illustrated in FIG. 6 is in part due to an asymmetry in the FRAM process for the example array that was tested.

Figure 7:
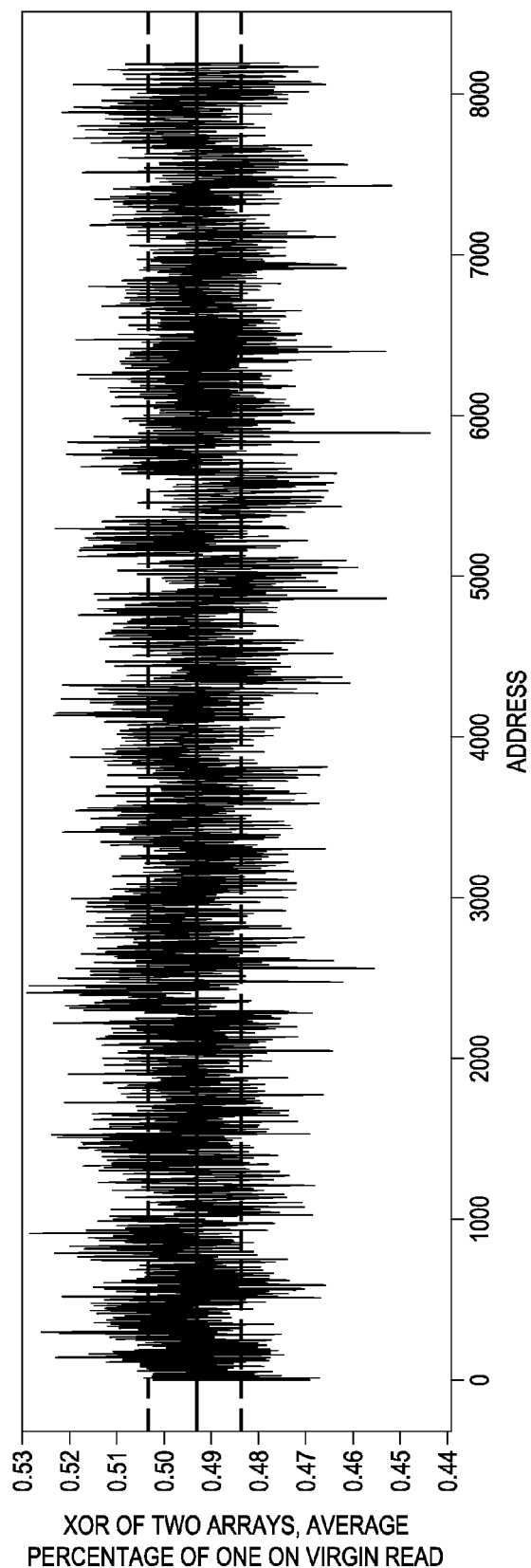

FIG. 7 is a plot illustrating the results of a bit by bit XOR of a virgin read of two 8 k×32 bit array of FRAM cells, again such as array 510. In this case, the plot records a value of one if both arrays have the same initial random value at the same bit location and a value of zero if the same bit location holds a different random value. As can be seen, the distribution of same random values is fairly consistent in the range of approximately 0.47-0.52 across the two arrays.

The requirements for producing a balanced FRAM cell are modest. Referring back to FIG. 2, the transistors in each side of sense amp 220 may be designed to be nearly identical so that the sense amp does not have a designed-in bias towards either a one or zero cell value. Similarly, each pair of FeCaps 201, 202 may be designed to be nearly identical so that the bit cell does not have a designed-in bias towards either a one or zero cell value.

Similarly, referring back to FIG. 3, the transistors in each side of sense amp 310 may be designed to be nearly identical so that the sense amp does not have a designed-in bias towards either a one or zero cell value. Similarly, each pair of FeCaps C1, C2 and C1', C2' may be designed to be nearly identical so that the bit cell does not have a designed-in bias towards either a one or zero cell value.

Similarly, referring back to FIG. 4, both sides of sense amp 410 may be designed to be nearly identical so that the sense amp does not have a designed-in bias towards either a one or zero cell value. Read capacitors 420, 421 and transfer gates 422, 423 may be designed to be nearly identical so that the bit column does not have a designed-in bias towards either a one or zero cell value.

Similarly, an array using a 1C-1T cell design may be designed in a manner so that the bit column does not have a designed-in bias towards either a one or zero cell value. In 1T-1C architectures the sense amp uses an internal reference to compare to the measured signal from the bit-cell to determine the bit state. An "average" signal magnitude between the magnitude of 0's and 1's may be used as the reference when interrogating the virgin cells. The value of the reference signal may need to be determined beforehand empirically through test data collection, for example. In this case, the value of the reference signal used during a read for a random number may be different than a reference value used during ongoing operation of the FRAM, for example.

Thus, when the basic cell and column structure is designed to have a balanced behavior, then random process variations will produce a random initial state in each bit cell, as described herein.

Figure 8:
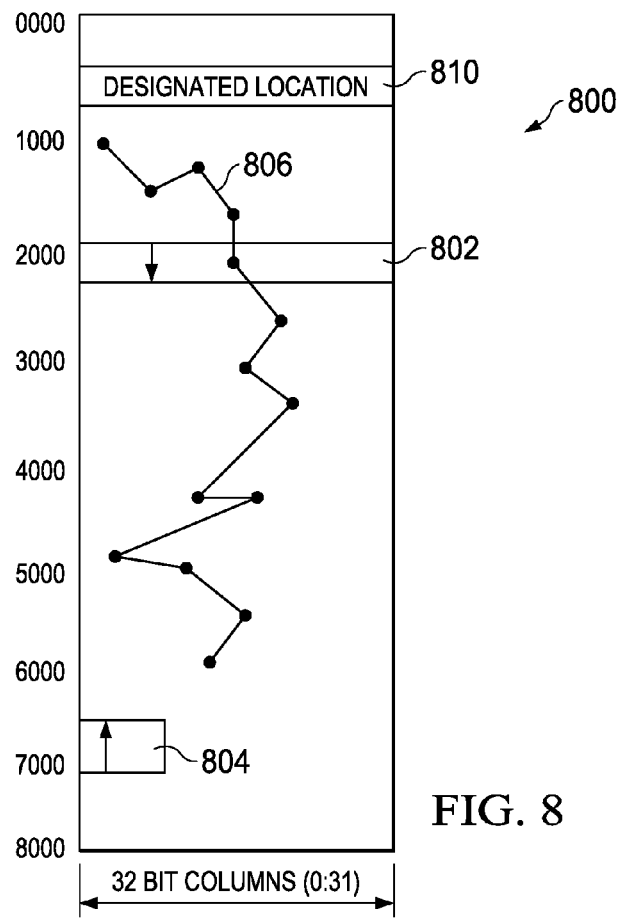
FIG. 8 is a plot illustrating various read sequences of a FRAM array for creating a random number.

FIG. 8 is a plot illustrating various read sequences of an FRAM array 800 for creating a random number. By reading a sequence of locations in an FRAM array, a random number of any length may be produced. In this example, FRAM array 800 is 8 k rows by 32 bits; however, the size of the array does not matter for creating a random number. As long as the cell and array has a balanced design, as described above, a sequence of bits, bytes, words, etc. may be read to create a random number. For example, sequence 802 represents a sequence of ten 32-bit words read in ascending address order to create a 320 bit random number. Sequence 804 represents a sequence of 40 8-bit bytes read in descending address order to create a 320 bit random number. Sequence 806 represents a sequence of 320 1-bit reads in a non-linear address order to create a 320 bit random number. As these sequences indicate, the sequence used to create a random number may be any sequence that is convenient to perform on FRAM 800. While a 320 bit random number is illustrated here, various size random numbers may be created by reading more or fewer FRAM cells.

As discussed above, in order to create a random number, the sequence must be read before a known pattern is written into the FRAM array. This may be done using a built in self-test program during an initial boot operation of a SoC, for example. In this case, the sequence may be read under control of a hardwired state machine in the SoC, for example. Alternatively, the sequence may be read under control of a program executed by a central processing unit (CPU) in the SoC by executing instructions stored in another non-volatile memory, such as a typical read only memory (ROM). Alternatively, the CPU may execute instructions that have been stored in a portion of the FRAM as long as another portion of the FRAM array is still virgin and the sequence is read from the virgin portion of the FRAM array.

If the FRAM array includes error checking and correction (ECC) logic, each virgin read will most likely result in an error detection indication. It may be useful to disable operation of the ECC logic prior to performing the sequence of virgin reads so that the error conditions are not created in the SoC which may interrupt the process of reading the sequence. However, if interrupts can be disabled or ignored so that error detection does not create a problem in itself, then the attempts by the ECC logic to correct one or two bits most likely will not affect the randomness of the virgin read operations and in this case the ECC logic may remain enabled.

Similarly, if the FRAM array includes an error detection capability, such as a parity check, then it may be useful to disable parity error interrupts to the SoC so that error detection does not create a problem.

Once the random number sequence is read, it may be written into FRAM 800 at a designated location, such as indicated at 810, so that it will then be available for use by the SoC for cryptographic or identification purposes, for example. Depending on the level of security that is required for an SoC, reading the random number sequence and storing the random number may be done in a protected security zone within the SoC using known or later developed techniques in order to maintain security from hackers or reverse engineering, for example.

Production Testing

Typically, when a SoC is fabricated, a semiconductor wafer is produced using multiple layers of conductive and semi-conductive materials to form hundreds or thousands of SoCs on each wafer. The wafer is typically tested by probing the wafer using multiple probes to activate and test each SoC while it is still in the wafer. The results of the probe tests are then recorded in a wafer map that is then used to sort out good and bad die after the wafer is sawn into individual die. The wafer map identifies the exact location of each die using a coordinate system that corresponds to the physical structure of the wafer. The probe test results (die quality) may be expressed as a single bit value, e.g., good (accept) or bad (reject), or a multiple bit value that provides additional information such as good first grade, good second grade, etc. The wafer map includes a plurality of bin numbers to categorize various attributes and/or properties of each die. For example, bin 1 may contain identification of all good first grade dice, bin 2 may contain identification of all good second grade dice, bin 3 may contain identification of all plug dice, bin 4 may contain identification of all bad dice, and bin 5 may contain identification of all edge bad dice. Each die may be assigned to a particular bin based on the results of the probe testing.

The wafer map host system, located in the production facility, receives the map data, provides storage, and enables data download into the production equipment to support processing of wafers to manufacture a semiconductor product. The wafer map host system may transform the lot's wafer map file into a suitable map file for the pick and place equipment to handle and prepares them for equipment download. In the manufacturing floor, as the wafer goes through the assembly process, a barcode may be generated for the wafer identification (ID) and is attached to the wafer or to a carrier frame. When the wafer is ready to be processed at the pick and place equipment, the frame or wafer ID barcode is scanned and is used to request the wafer map from the wafer map host system. P/P station uses the downloaded wafer map to step to the good chips for pick-up.

After the wafer is separated into individual die, the dies are packaged and may then be tested again to assure correction operation of the packaged SoC.

Typically, a pattern test may be performed on a memory array to verify correct operation of the memory array. As discussed above, if the FRAM array is written to, the ability to produce a random number by reading a sequence of FRAM bits may be lost. Thus, in order to generate a random number as described above, either the probe test or the final test may be used to perform an initial read of a sequence of locations prior to performing a memory pattern test. The sequence may then be stored by the test equipment until all testing is complete, and then be written into a designated location in the FRAM array, such as location 810, or into another location in other non-volatile memory within the SoC, for example. Alternatively it can be stored in volatile memory such as SRAM as long as the tester does not remove the power from this volatile memory.

In the case where the probe test may impact the FRAM, an initial sequence read may be performed by the probe tester and the resultant random number for each SoC on the wafer may then be stored along with the wafer map, for example. Once the individual SoC are packaged, the random numbers may be retrieved from the wafer map database and written into a designated location in the SoC, for example.

Alternatively, the probe test and final test may be performed in a way that leaves enough locations in the FRAM in a virgin state so that pattern testing may be performed on a portion of the FRAM array to verify the array is functional, while leaving another portion of the FRAM array in a virgin state. In this manner, the initial read sequence of virgin locations may be performed after the SoC is incorporated into a final system, such as during an initial boot operation, for example.

Figure 9:
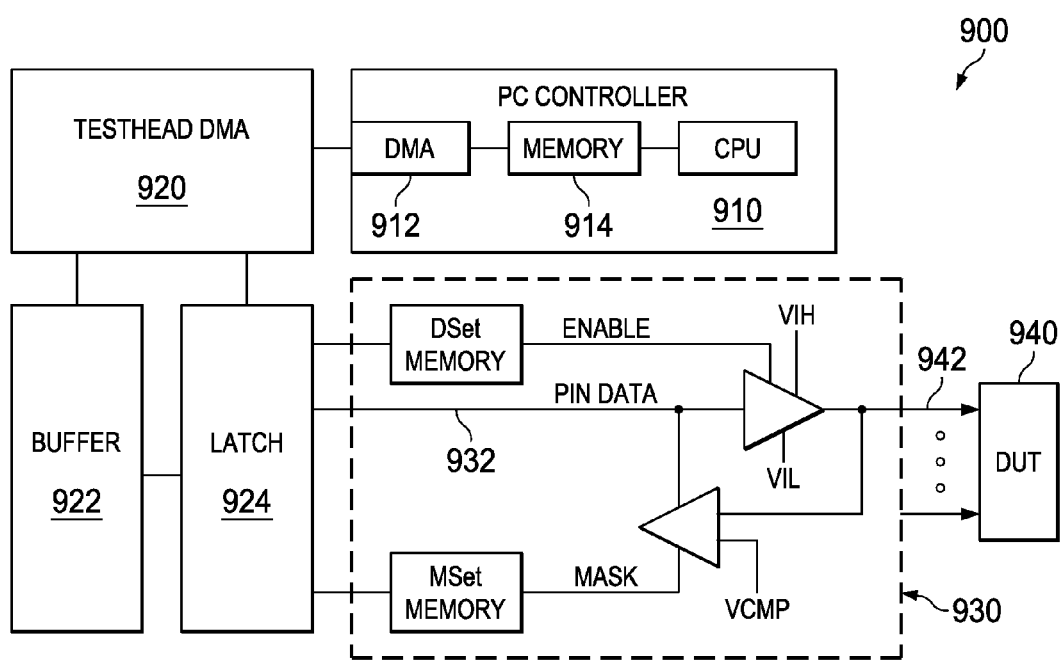
FIG. 9 is a block diagram of an example test system.

FIG. 9 is a block diagram of a tester 900 that may be used to test packaged integrated circuits. Controller 910 may be a personal computer type device, or any sort of computer system that may include a processor (CPU) and a memory 914. The memory may be loaded with a program for execution by the CPU that controls the operation of the tester 900. Controller 910 may also include various peripheral connections for connecting to a user interface (not shown) and/or to a local or wide area network using now known or later developed communication protocols. In this manner, controller 910 may be controlled by a local station operator using the user interface, or may be interconnected with a larger production control system, for example.

The test system may include a direct memory access (DMA) engine 920 that may be coupled to DMA engine 912 within controller 912 to allow sequences of data words to be transferred from the memory of controller 910 to a buffer 922 and thereby to latch 924. The general operation of DMA transfers is well known and need not be described in detail herein. Basically, a starting address and length of transfer may be provided to the DMA engine by a program executing on the CPU of controller 910, which then sequentially transfers the requested sequence of data in a periodic manner from memory 914 to the tester.

The data in latch 924 may then be provided to a device under test 940 using a pin circuit. Pin circuit 930 is representative of multiple pin circuits that allow multiple pins on a DUT to be driven or monitored. In this case, DUT 940 is a SoC with a FRAM array, as described above. Data on pin line 932 from a bit in latch 924 may be applied to pin 942 of DUT 940 that provides a test signal to DUT 940. A similar pin circuit may then the connected to an output pin of DUT 940 to monitor a signal that is produced in response to input signal 942. A data set (DSet) control word and a mask set (MSet) control word may be used to control a pin driver or a pin receiver in pin circuit 930, for example.

In this manner, the test system may stimulate the packaged SoC 940 to perform a sequential read of the FRAM to generate a random number, save the number in tester memory such as memory 914, and then write the random number into a designated location within SoC 940 for later use in cryptographic and/or identification applications, for example.

Figure 10:
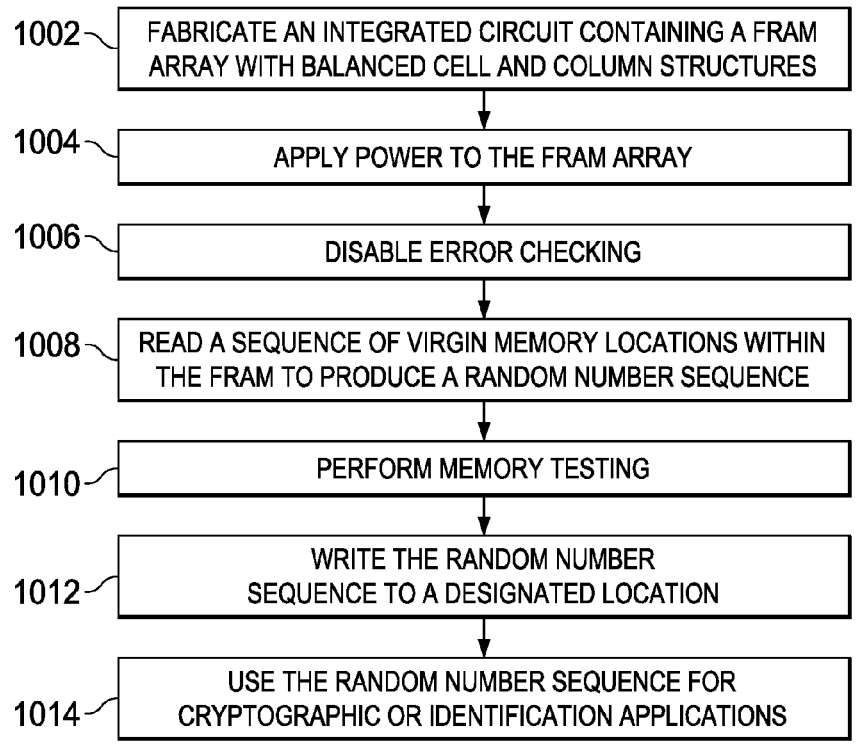
FIG. 10 is a flow chart illustrating generation of a random number using a FRAM array.

FIG. 10 is a flow chart illustrating generation of a random number using a FRAM array. As described in more detail above, a SoC integrated circuit is fabricated 1002 that has a FRAM array using balanced cell and array column structures so that normal process variations will result in random spontaneous nonzero polarization of each bit cell in the FRAM array.

Operating power is applied 1004 to the FRAM array. As discussed in more detail above, this may be during probe testing, during final testing, or after final testing as long as no write cycles have been performed on the FRAM locations that will be included in a virgin read sequence. Probe test and final test may be performed in a way that leaves enough locations in the FRAM in a virgin state so that pattern testing may be performed on a portion of the FRAM array to verify the array is functional, while leaving another portion of the FRAM array in a virgin state. In this manner, the initial read sequence may be performed after the SoC is incorporated into a final system, such as during an initial boot operation, for example.

As discussed above, depending on the configuration of the FRAM array and the way the SoC responds to memory errors, it may be necessary to disable 1006 error detection or error checking and correction prior to performing the virgin read sequence. Alternatively, as long as the SoC or test system can tolerate the error indications, the ECC or parity circuits may be left enabled.

A sequence of virgin memory locations within the FRAM device is read 1008 to produce the random number sequence. As discussed above in more detail, the sequence of virgin memory locations had previously never been written. However, as discussed above, other portions of the FRAM array may have been written to during testing or to load boot code instructions, for example. As discussed above in more detail, the virgin sequence may be consecutive bits, bytes, word, etc., or it may be scattered throughout the FRAM, for example.

As discussed above in more detail, memory testing may be performed 1010 after the virgin sequence has been read 1008, or memory testing may have been performed before the virgin sequence is read as long as the portion of the FRAM that contains the virgin sequence remains unwritten.

The random number sequence derived from reading the virgin sequence in the FRAM array is saved by writing 1012 it to a designated location. The designated location may be in the FRAM or in another non-volatile memory within the SoC, as discussed in more detail above.

Various applications within the SoC may then use 1014 the random number. The random number may be used as a cryptographic primitive for data encryption or signature generation. For strong encryption, a random number of at least 256 bits may be required.

Similarly, the random number may be used as a Physically Unclonable Function (PUF) to generate a key for a cryptographic application. Rather than embodying a single cryptographic key, PUFs implement challenge-response authentication. When a stimulus is applied to the structure, it reacts in an unpredictable (but repeatable) way due to the complex interaction of the stimulus with the physical microstructure of the device. This exact microstructure depends on physical factors introduced during manufacture which are unpredictable. The applied stimulus is called the challenge, and the reaction of the PUF is called the response. A specific challenge and its corresponding response together form a challenge-response pair or CRP see "Physical unclonable function," Wikipedia, as of May 29, 2014. The device's identity is established by the properties of the microstructure itself. As this structure is not directly revealed by the challenge-response mechanism such a device is resistant to spoofing attacks.

Unclonability means that each PUF device has a unique and unpredictable way of mapping challenges to responses, even if it was manufactured with the same process as a similar device, and it is infeasible to construct a PUF with the same challenge-response behavior as another given PUF because exact control over the manufacturing process is infeasible. As described above in more detail, a virgin FRAM will produce a random number sequence that is unique to that SoC. Multiple sequences may be read to create multiple random numbers that may be used to respond to multiple challenges, for example. FRAM used as described above can be classified as a weak-PUF that can be used for identification purposes or to store cryptographic keys. The term Weak PUF refers to PUFs with a limited number of challenge-response pairs (CRPs) in contrast to strong PUFs that contain many CRPs. The advantage of FRAM-PUF as described above over SRAM-PUF is its robustness. Indeed after the initial read, the response is stored in the structure itself and therefore does not suffer from noisy further readings.

The random number may be used as an identification number for the FRAM device, for example. In this case, it may be treated as a serial number or used to identify a device, such as a radio frequency identification (RFID) tag, for example.

System Example

Figure 11:
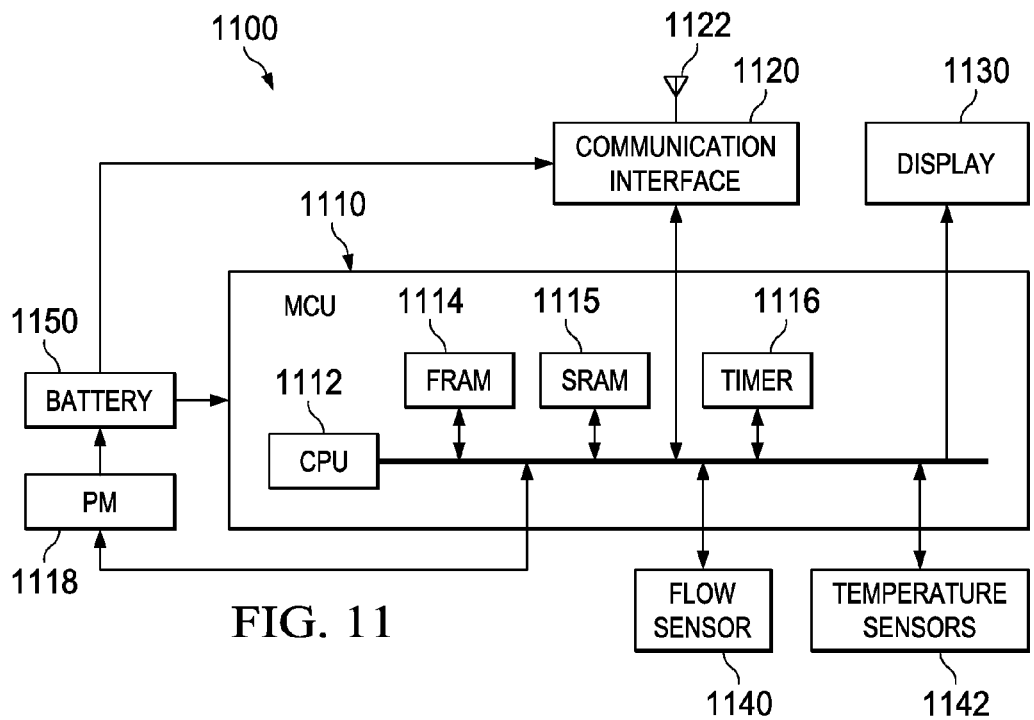
FIG. 11 is a block diagram of an example SoC that includes a FRAM array.

FIG. 11 is a block diagram of an example SoC 1100 that includes a FRAM array that may be used to produce a random number by reading a virgin sequence of locations, as described in more detail above. In this example, SoC 1100 is a wireless sensor that may be used for gathering information. Sensor node 1100 includes a microcontroller (MCU) 1110 coupled to a communications interface 1120. MCU 1110 may include an FRAM storage module 1114, a static random access memory 1115, one or more timer modules 1116, and other various interfaces for coupling to communications interface 1120, display 1130, and sensors 1140, 1142.

MCU 1110 may be embodied as an MSP430FR57xx available from Texas Instruments, for example. The Texas Instruments MSP430FR57xx family of ultralow-power microcontrollers includes multiple devices featuring embedded FRAM nonvolatile memory, ultralow power 16-bit MSP430 CPU, and different peripherals targeted for various applications.

In this example, FRAM 1114 provides 16 kB of storage, SRAM 1115 provides 1 KB of storage, CPU 1112 is a 16-Bit RISC Architecture that operates at speeds up to 8-MHz. However, other embodiments may include other types of CPU and different memory capacities. Since the FRAM is non-volatile, an application program may be stored within FRAM 1114 for execution by CPU 1112. A portion of FRAM 1114 may also be allocated for use as a data memory to store data that is collected from sensors 1140, 1142. Since FRAM does not have the write restrictions associated with Flash non-volatile memory, FRAM 1114 may be used as a scratch pad memory during processing of the collected sensor data, for example.

Communications interface 1120 may include a transmitter and a receiver for wireless communication with an external controller. Interface 1120 may communicate using RF standards such as ZigBee, which is popular in low data rate, low power applications, for example. Interface 1120 may be embodied as a CC3000-TiWI-SL module, available from Texas Instruments, for example.

Display 1130 may be a simple set of LEDs (light emitting diodes), or a more complex LCD (liquid crystal display), for example. In some embodiments, display 1130 may be omitted.

This example includes a flow sensor 1140 for sensing water flow rates and two temperature sensors 1142 for sensing air temperature. However, various embodiments may include a wide range of known or later developed sensors that may be used to collect various types of environmental data. This example of MCU 1110 includes a 200-ksps 10-bit ADC and two op-amps that may be used to gather and process environmental data from sensor 1140, 1142.

Battery 1150 provides power to MCU 1110, communication interface 1120, display 1130, and sensors 1140, 1142. Power management (PM) logic 1118 may be included within MCU 1110, or it may be separate. PM logic 1118 may be configured to control power levels provided to MCU 1110, communications interface 1120, display 1130, and sensors 1140, 1142. Various schemes for controlling and changing power consumption by various domains within an integrated circuit and multichip system that are now known or later developed may be used by PM 1118. For example, this may include raising or lowering voltage levels provided by battery 1150 to the various components. This may also include changing a clock rate provided to MCU 1110, for example.

In this example, a system may include hundreds or thousands of sensors that each needs a unique identification number. A self generating random number read from a virgin sequence in FRAM 1114 as described herein may be used for that purpose.

In this example, the data collected and transmitted by the system may need to be encrypted for security purposes. Encryption may be performed using a key derived from a random number generated by reading a virgin sequence from FRAM 1114, as described in more detail herein.

Other Embodiments

Although the invention finds particular application to microcontrollers (MCU) implemented, for example, in a System on a Chip (SoC), it also finds application to other forms of processors and integrated circuits. A SoC may contain one or more modules which each include custom designed functional circuits combined with pre-designed functional circuits provided by a design library.

While the invention has been described with reference to illustrative embodiments, this description is not intended to be construed in a limiting sense. Various other embodiments of the invention will be apparent to persons skilled in the art upon reference to this description. For example, other, fixed, portable, or mobile systems such as remote controls, access badges and fobs, smart credit/debit cards and emulators, smart phones, digital assistants, and any other now known or later developed portable or embedded system may require random numbers as described herein to allow for identification and/or security. In some embodiments, the random number may be provided to another system that may use the random number as an identification number for the fixed, portable, or mobile system, for example.

In some embodiments, a built-in self-test (BIST) capability may be implemented that reads the virgin FRAM array and stores a resulting random number in another type of non-volatile memory such as an eFUSE or EPROM (electrically programmable read only memory), or other one time programmable (OTP) device, for example. In another embodiment, a BIST mechanism may store the resulting random number in a volatile memory such as an SRAM, for example. In some embodiments, the BIST mechanism may be executed before testing the FRAM array during production testing. In some embodiments, the BIST mechanism may then read the random number from the volatile SRAM location and store the random number back into the FRAM array after production testing, for example.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for generating a random number based on physical characteristics of virgin cells of a ferroelectric random access memory (FRAM) array, the method comprising:
   receiving, by the FRAM array of a System on a Chip (SoC), the FRAM array comprising a plurality of virgin cells, operating power; and
   reading, by a processor of the SoC, the plurality of virgin cells of the FRAM array, after the FRAM array receives the operating power, to generate the random number based on spontaneous polarization of the plurality of virgin cells of the FRAM array and randomness from process variations of the plurality of virgin cells of the FRAM array, wherein the plurality of virgin cells has previously never been written.

2. The method of claim 1, wherein the FRAM array comprises error correction logic, the method further comprising disabling error correction before reading the plurality of virgin cells.

3. The method of claim 1, further comprising performing data encryption or signature generation using the random number as a cryptographic primitive.

4. The method of claim 1, further comprising assigning the random number to be an identification number for the FRAM array.

5. The method of claim 1, further comprising generating a cryptographic key using the random number as a Physically Unclonable Function (PUF).

6. The method of claim 1, further comprising storing the random number in another non-volatile memory or in the FRAM array.

7. The method of claim 6, further comprising:
performing a memory test of the FRAM array after storing the random number.

8. The method of claim 7, wherein performing the memory test on the FRAM array comprises performing a built in self-test (BIST) during initial boot operation.

9. The method of claim 1, wherein the plurality of virgin cells is scattered throughout the FRAM array.

10. The method of claim 1, wherein the plurality of virgin cells comprises at least 256 bits.

11. The method of claim 1, wherein the plurality of virgin cells has previously never been read.

12. A system on a chip (SoC) for generating a random number based on physical characteristics of virgin cells of a ferroelectric random access memory (FRAM) array, the SoC comprising:
the FRAM array comprising a plurality of virgin cells, the FRAM array configured to receive operating power;
a processor coupled to the FRAM array; and
a non-transitory computer readable storage meaning storing a program for execution by the processor, the program including instructions to: read the plurality of virgin cells of the FRAM array, after the FRAM array receives the operating power, to generate the random number based on spontaneous polarization of the plurality of virgin cells of the FRAM array and randomness from process variations of the plurality of virgin cells of the FRAM array, wherein the plurality of virgin cells has previously never been written.

13. The SoC of claim 12, wherein the FRAM array comprises error correction logic, wherein the instructions further comprise instructions to disable error correction before reading the plurality of virgin cells.

14. The SoC of claim 12, wherein the instructions further comprise instructions to perform data encryption or signature generation using the random number as a cryptographic primitive.

15. The SoC of claim 12, wherein the instructions further comprise instructions to assign the random number to be an identification number for the FRAM array.

16. The SoC of claim 12, wherein the instructions further comprise instructions to generate a cryptographic key using the random number as a Physically Unclonable Function (PUF.

17. The SoC of claim 12, wherein the plurality of virgin cells is scattered throughout the FRAM array.

18. The SoC of claim 12, wherein the plurality of virgin cells comprises at least 256 bits.

19. The SoC of claim 12, wherein the plurality of virgin cells has previously never been read.

20. The SoC of claim 12, wherein the instructions further comprise instructions to:
store the random number in the FRAM array; and
perform a memory test of the FRAM array after storing the random number in the FRAM array.

* * * * *